(12) United States Patent
Randahl et al.

(10) Patent No.: US 6,757,834 B2
(45) Date of Patent: Jun. 29, 2004

(54) METHOD AND ARRANGEMENT FOR MINIMIZING POWER DISSIPATION IN A LINE DRIVER

(75) Inventors: Torbjörn Randahl, Nacka (SE); Albin Johansson, Haninge (SE); Anders Söderbärg, Norrtälje (SE); Tore André, Älvsjo (SE); Allan Olson, Spånga (SE)

(73) Assignee: Infineon Technologies AG, Munich (DE)

( * ) Notice: Subject to any disclaimer, the term of this patent is extended or adjusted under 35 U.S.C. 154(b) by 641 days.

(21) Appl. No.: 09/826,962

(22) Filed: Apr. 6, 2001

(65) Prior Publication Data

US 2001/0034851 A1 Oct. 25, 2001

(30) Foreign Application Priority Data

Apr. 7, 2000 (SE) ................................................ 0001301

(51) Int. Cl.$^7$ ................................................ G06F 1/32
(52) U.S. Cl. ........................................ 713/320; 375/227
(58) Field of Search ............................... 713/300, 320, 713/340; 375/227

(56) References Cited

U.S. PATENT DOCUMENTS

| | | | |
|---|---|---|---|
| 4,630,284 A | 12/1986 | Cooperman | |
| 5,235,617 A | 8/1993 | Mallard, Jr. | |
| 5,644,255 A | 7/1997 | Taylor | |
| 6,028,486 A | 2/2000 | Andre | |
| 6,389,065 B1 * | 5/2002 | McGhee | 375/222 |
| 6,580,760 B1 * | 6/2003 | Larsen | 375/257 |
| 6,583,662 B1 * | 6/2003 | Lim | 327/553 |
| 6,646,994 B1 * | 11/2003 | Hendrichs et al. | 370/252 |

FOREIGN PATENT DOCUMENTS

| | | |
|---|---|---|
| EP | 0955736 Y | 11/1999 |
| SE | 511167 A | 6/1999 |

* cited by examiner

*Primary Examiner*—Dennis M. Butler
(74) *Attorney, Agent, or Firm*—Burns, Doane, Swecker & Mathis, L.L.P.

(57) ABSTRACT

To minimize power dissipation in a line driver (3) in a central office (CO) for driving a DSL connection to a network terminal (NT) with a predetermined maximum constellation size, the central office (CO) supplies the line driver (3) with a predetermined supply voltage during a training sequence, and transfers data with a predetermined power spectral density in all available channels. The network terminal (NT) measures the signal-to-noise ratio of each channel, and transfers information to the central office (CO) about channels having signal-to-noise ratios that enable transfer of data. The central office (CO) reduces the power spectral density to a lowest possible value that still enables transfer of data in all channels having signal-to-noise ratios above a predetermined threshold as set by the maximum constellation size, calculates a sum of power to be transmitted in said channels, converts said sum into a corresponding line driver output voltage, and reduces the line driver supply voltage in correspondence thereto.

6 Claims, 1 Drawing Sheet

METHOD AND ARRANGEMENT FOR MINIMIZING POWER DISSIPATION IN A LINE DRIVER

TECHNICAL FIELD

The invention relates generally to line drivers and more specifically to minimizing power dissipation in line drivers driving DSL (digital Subscriber Line) connections to network terminals.

BACKGROUND OF THE INVENTION

In line drivers in a central office for driving DSL connections of unknown lengths to network terminals, the supply voltage to driving transistors in the final stage of the line drivers, is set to a fixed value to give a fixed line driver output voltage in order to secure data transmission to the network terminals irrespective of the length of the DSL connections.

There is a desire to put more and more line drivers on one and the same printed circuit board.

With more and more line drivers on the same printed circuit board, there is a risk that the power dissipation from the line drivers will be too high on the printed circuit board.

SUMMARY OF THE INVENTION

The object of the invention is to minimize the power dissipation of the line drivers on such printed circuit boards in order to be able to put more line drivers on one and the same printed circuit board.

This is attained in accordance with the invention by reducing the power spectral density to a lowest possible value that enables transfer of data and in response hereto reducing the supply voltage of the line drivers.

Hereby, also the power dissipation of the line drivers will be minimized.

BRIEF DESCRIPTION OF THE DRAWING

The invention will be described more in detail below with reference to the appended drawing on which FIG. 1 schematically illustrates a DSL connection between a central office and a network terminal.

DESCRIPTION OF THE INVENTION

Figure 1:
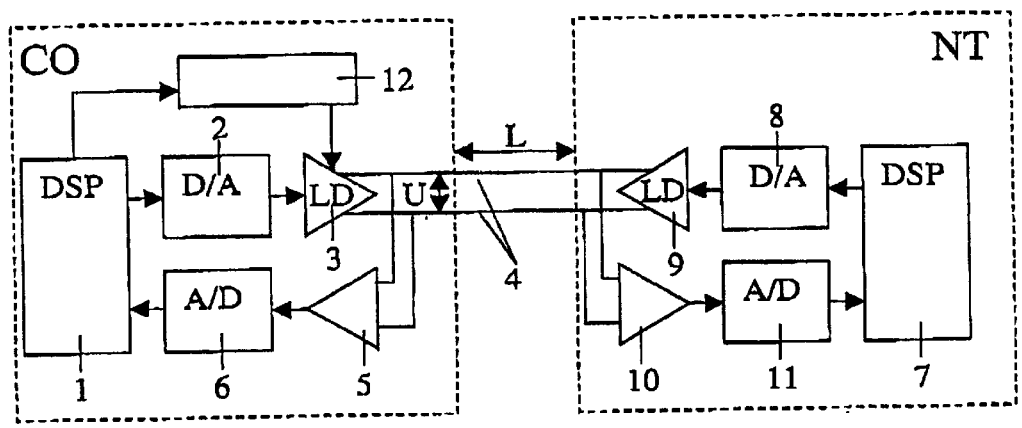

FIG. 1 is a schematic illustration of a DSL connection between a central office CO and a network terminal NT.

In a manner known per se, the central office CO comprises a transmitter path and a receiver path.

The transmitter path comprises a digital signal processor 1 that is connected to an input of a D/A converter 2 whose output is connected to an input of a line driver 3 connected with its outputs to a transmission line 4 to the network terminal NT.

The receiver path in the central office CO comprises a receiver 5 connected with its input terminals to the wires of the transmission line 4 and with its output to an input of an A/D converter 6 whose output is connected to an input of the digital signal processor 1 in the central office CO.

Also, in a manner known per se, the network terminal NT comprises a transmitter path and a receiver path.

In the network terminal NT, the transmitter path comprises a digital signal processor 7 connected with an output to a D/A converter 8 which in its turn is connected with an output to an input of a line driver 9. The line driver 9 is connected with its outputs to the wires of the transmission line 4 to the central office CO.

The receiver path in the network terminal NT comprises a receiver 10 connected with its input terminals to the wires of the transmission line 4 and with its output to an A/D converter 11 connected with its output to an input of the digital signal processor 7.

Even if it is not illustrated in FIG. 1, it is to be understood that in the central office CO, there are a plurality of line drivers located on one and the same printed circuit board (not shown), and connected to different network terminals.

In accordance with the invention, to reduce the power dissipation of the line drivers 3 in the central office CO, a source 12 of different line driver supply voltages is provided in the central office CO.

In the embodiment in FIG. 1, the supply voltage source 12 is controlled by the digital signal processor 1 to supply different supply voltages to the line driver 3.

The setting of the proper supply voltage is carried out in the following manner during a training sequence initiated by the central office CO to set up a DSL connection between the central office CO and the network terminal NT.

Initially, the digital signal processor 1 in the central office CO controls the supply voltage source 12 to supply the line driver 3 with a predetermined supply voltage, e.g. a maximum supply voltage.

Data is then transferred with a predetermined power spectral density in all available channels of the transmission line 4 to the network terminal NT.

In the network terminal NT, the data is received by the receiver 10 and converted into digital format by the A/D converter 11. In the digital signal processor 7, the signal-to-noise ratio (SNR) of each channel is measured.

The network terminal NT then transfers information to the central office CO about the channels that have SNRs that enable transfer of data.

In the central office CO, the digital signal processor 1 reduces the power spectral density to a lowest possible value that enables transfer of data in all channels having SNRs above a predetermined threshold as set by a maximum constellation size to be used for the DSL connection.

Based on the reduced power spectral density, the digital signal processor 1 in the central office CO calculates a sum of the power to be transmitted in the channels of the transmission line 4 having SNRs above the predetermined threshold.

This sum of total power to be transmitted is converted by the digital signal processor 1 into a corresponding line driver output voltage and in correspondence hereto, the digital signal processor 1 reduces the supply voltage to be supplied by the supply voltage source 12 to the line driver 3.

The power spectral density can be reduced to the lowest possible value in steps in such a manner that the SNRs of the channels are measured after each lowering of be power spectral density to check that transfer of data is still possible.

Preferably, the line driver supply voltage is set to a minimum value enabling transfer of data in all channels having SNRs above the predetermined threshold.

Figure 2:
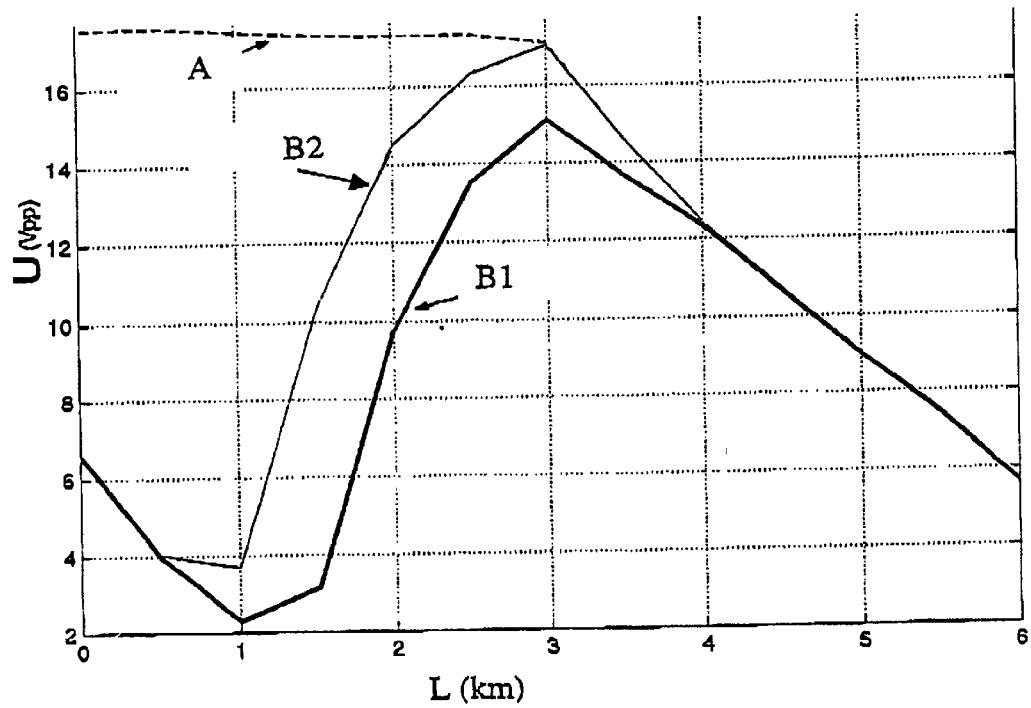
FIG. 2 is a diagram illustrating line driver output voltage as a function of line length.

In FIG. 2, diagrams show line driver output voltage U versus line length L, both traditionally as illustrated by a dashed line A, and in accordance with the invention as illustrated by a solid lines B1 and B2 representing constellation sizes 11 and 15, respectively.

Traditionally, as apparent from curve A in FIG. 2, the output voltage U of the line driver is more or less constant for all line lengths L up to about 3 km from the beginning to secure data transmission irrespective of the line length.

In accordance with the invention, as apparent from curves B1 and B2 in FIG. 2, the line driver output voltage U can be lowered considerably for line lengths up to about 3 km.

Hereby, the power dissipation of the line driver 3 can be lowered accordingly.

What is claimed is:

1. A method of minimizing power dissipation in a line driver in a central office for driving a DSL connection of unknown length to a network terminal with a predetermined maximum constellation size, characterized by the following steps during a training sequence initiated by the central office to set up the connection:
   a) at the central office, supplying the line driver with a predetermined supply voltage, and
   b) transferring data with a predetermined power spectral density in all available channels to the network terminal,
   c) at the network terminal, measuring signal-to-noise ratio of each channel, and
   d) transferring information to the central office about channels having signal-to-noise ratios that enable transfer of data,
   e) at the central office, reducing the power spectral density to a lowest possible value that enables transfer of data in all channels having signal-to-noise ratios above a predetermined threshold as set by the maximum constellation size,
   f) calculating a sum of power to be transmitted in said channels having signal-to-noise ratios above the predetermined threshold,
   g) converting said sum into a corresponding line driver output voltage, and
   h) reducing the line driver supply voltage in correspondence thereto.

2. The method according to claim 1, characterized in that step e) comprises transferring data with a predetermined lower power spectral density in the channels that have signal-to-noise ratios above the predetermined threshold, and repeating steps (c)–(e) as long as the signal-to-noise ratio in said channels is above the predetermined threshold.

3. The method according to claim 1, characterized in that step h) comprises setting the line driver supply voltage to a minimum value.

4. An arrangement for minimizing power dissipation in a line driver (3) in a central office (CO) for driving a DSL connection of unknown length to a network terminal (NT) with a predetermined maximum constellation size, characterized in
   that the central office (CO) comprises control means adapted to supply the line driver (3) with a predetermined supply voltage during a training sequence to set up the connection, and to transfer data with a predetermined power spectral density in all available channels to the network terminal (NT),
   that the network terminal (NT) comprises means for measuring the signal-to-noise ratio of each channel, and for transferring information to the central office (CO) about channels having signal-to-noise ratios that enable transfer of data, and
   that said control means in the central office (CO) moreover are adapted to reduce the power spectral density to a lowest possible value that enables transfer of data in all channels having signal-to-noise ratios above a predetermined threshold as set by the maximum constellation size, to calculate a sum of power to be transmitted in said channels having signal-to-noise ratios above the predetermined threshold, to convert said sum into a corresponding line driver output voltage, and to reduce the line driver supply voltage in correspondence thereto.

5. The arrangement according to claim 4, characterized in that said control means in the central office (CO) are adapted to reduce the power spectral density stepwise.

6. The arrangement according to claim 4, characterized in that said control means in the central office are adapted to set the supply voltage to the line driver to a minimum value.

* * * * *